United States Patent
Jo

(10) Patent No.: US 7,297,607 B2
(45) Date of Patent: Nov. 20, 2007

(54) DEVICE AND METHOD OF PERFORMING A SEASONING PROCESS FOR A SEMICONDUCTOR DEVICE MANUFACTURING APPARATUS

(75) Inventor: Bo-Yeoun Jo, Gimpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/303,891

(22) Filed: Dec. 15, 2005

(65) Prior Publication Data

US 2006/0141798 A1   Jun. 29, 2006

(30) Foreign Application Priority Data

Dec. 27, 2004   (KR) .................. 10-2004-0113250

(51) Int. Cl.
*H01L 21/331*   (2006.01)
(52) U.S. Cl. .................. 438/339; 257/E21.544; 257/557
(58) Field of Classification Search ............ 438/478, 438/184, 193, 195–198, 200–203, 206–207, 438/209–211, 218, 237, 165, 294, 308, 337, 438/353, 6, 10, 104, 107–114, 118, 121–123, 438/128–129, 135, 142, 145, 149, 151, 157, 438/176
See application file for complete search history.

(56) References Cited

U.S. PATENT DOCUMENTS

| | | | | |
|---|---|---|---|---|
| 4,586,243 | A * | 5/1986 | Weaver et al. | 438/339 |
| 6,890,834 | B2 * | 5/2005 | Komobuchi et al. | 438/455 |
| 6,965,107 | B2 * | 11/2005 | Komobuchi et al. | 250/338.1 |
| 7,026,223 | B2 * | 4/2006 | Goodrich et al. | 438/456 |
| 2002/0173149 | A1 * | 11/2002 | Yanagisawa et al. | 438/689 |
| 2003/0183920 | A1 * | 10/2003 | Goodrich et al. | 257/701 |

* cited by examiner

*Primary Examiner*—Michael Lebentritt
*Assistant Examiner*—Andre' Stevenson
(74) *Attorney, Agent, or Firm*—Andrew D. Fortney

(57) ABSTRACT

A method of performing a seasoning process for a semiconductor device processing apparatus is provided by the present invention. The method includes: forming a material layer on a test wafer; coating a photoresist on the material layer; patterning the photoresist so as to expose a central region of the wafer and cover an edge region thereof; and etching the material layer exposed by the photoresist pattern.

20 Claims, 5 Drawing Sheets

DEVICE AND METHOD OF PERFORMING A SEASONING PROCESS FOR A SEMICONDUCTOR DEVICE MANUFACTURING APPARATUS

CROSS-REFERENCE TO RELATED APPLICATION

This application claims priority to and the benefit of Korean Patent Application No. 10-2004-0113250, filed in the Korean Intellectual Property Office on Dec. 27, 2004, the entire contents of which are incorporated herein by reference.

BACKGROUND OF THE INVENTION (a) Field of the Invention

The present invention relates to a method of performing a seasoning process for a semiconductor device, and more particularly, to a method of seasoning a semiconductor processing chamber (or apparatus) that reduces an etch residue created in a process for manufacturing a semiconductor device.

(b) Description of the Related Art

Since semiconductor devices have been more highly integrated due to recent developments in manufacturing processes, critical dimensions thereof have also been reduced. A dry-etching process is mainly used for forming a pattern in a semiconductor device. In order to ensure a precise critical dimension, the dry-etching process should have high selectivity with respect to etching certain layers, structures or materials (and not others). The dry-etching process should also provide a precise amount of etching (or have a predictable etch rate under predetermined etch conditions). Moreover, it is important to maintain the reproducibility of the manufacturing processes for each wafer.

However, when a dry-etching process is performed directly after firstly setting or cleaning a dry-etching chamber, or directly after an idling time between processes, etching loss(es) may occur on a running wafer due to an unstable atmosphere (or other unstable condition[s]) in the dry-etching chamber.

In order to prevent such a problem in a dry-etching process, a seasoning process using a test wafer may be performed before a main etching process on production wafers. A seasoning process is a process for etching a test wafer before performing the main etching process, and one objective of the seasoning process is to "season" a processing chamber, or provide a more stable and/or reliable processing environment in the chamber. A seasoning process is therefore performed in the same chamber and under the same process conditions as the main etching process.

FIG. 1A to FIG. 1D are cross-sectional views showing sequential stages of a conventional method of performing a seasoning process for a semiconductor device. A conventional seasoning process for an apparatus adapted to form (or etch) metal lines of a semiconductor device will hereinafter be described with reference to FIG. 1A to FIG. 1D.

As shown in FIG. 1A, an anti-reflection coating (ARC) layer 12, a metal layer 14, and an anti-reflection coating layer 16 are sequentially deposited or otherwise formed on an (interlayer) insulating layer 10, as layers to form a structure in a semiconductor substrate. Here, the insulating layer 10 includes an insulating material, such as USG, BSG, PSG, BPSG, etc., and the anti-reflection coating layers 12 and 16 generally comprise a metal material, such as Ti, TiN, or a metal alloy material such as TiW alloy. In addition, the metal layer 14 comprises a metal material, such as Al or Cu.

As shown in FIG. 1B, a photoresist 20 is coated on an entire surface of the anti-reflection coating layer 16 by using a spin coating scheme.

As shown in FIG. 1C, a pattern to define a metal line region is formed when the photoresist 20 is patterned by an exposing and developing process using a metal line mask.

In addition, as shown in FIG. 1D, before performing a main etching process in a dry-etching chamber, metal interconnection lines are formed on a test or "dummy" wafer in a seasoning process by dry-etching the anti-reflection coating layer 16, the metal layer 14, and anti-reflection coating layer 12 thereon using the photoresist pattern 20 as an etch mask. Subsequently, the photoresist pattern 20 and an etch residue are removed from the test/dummy wafer by performing an ashing process, for example.

However, when dry-etching the metal layer 14 on the test or dummy wafer, a conventional seasoning process for a semiconductor device may create an etch residue in the etching chamber (or apparatus), and an amount of etch residue in a central region of the test/dummy wafer is different from that of an edge region of the test/dummy wafer. That is, the central region of the wafer may have an etch residue of which a main source is a photoresist, but the edge region of the wafer may have an etch residue of which a main source is an anti-reflection coating layer or metal layer. Therefore, the etch residue may not be uniformly accumulated on the wafer, and the total amount of etch residue in the etching chamber (or apparatus) may increase.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to provide a method of performing a seasoning process for a semiconductor device processing apparatus having advantages of reducing an etch residue in a test or dummy wafer by accumulating an etch residue uniformly in a central region and an edge region of a wafer. Such advantages may be gained when a dry-etching process is performed by patterning a photoresist which is coated on a test wafer so as to open a central region of the wafer and to close an edge region of the wafer.

An exemplary method of patterning a test wafer for seasoning a semiconductor process chamber or apparatus according to an embodiment of the present invention includes: forming a material layer on a test wafer; coating a photoresist on the patterning material layer; and patterning the photoresist so as to expose one or more central regions of the wafer and to cover an edge region thereof. An exemplary method of seasoning a semiconductor process chamber or apparatus according to another embodiment of the present invention includes: performing the present method of patterning a test wafer; and dry-etching the material layer exposed by the photoresist pattern.

DETAILED DESCRIPTION OF THE EMBODIMENTS

An exemplary embodiment of the present invention will hereinafter be described in detail with reference to the accompanying drawings.

Figure 1A:
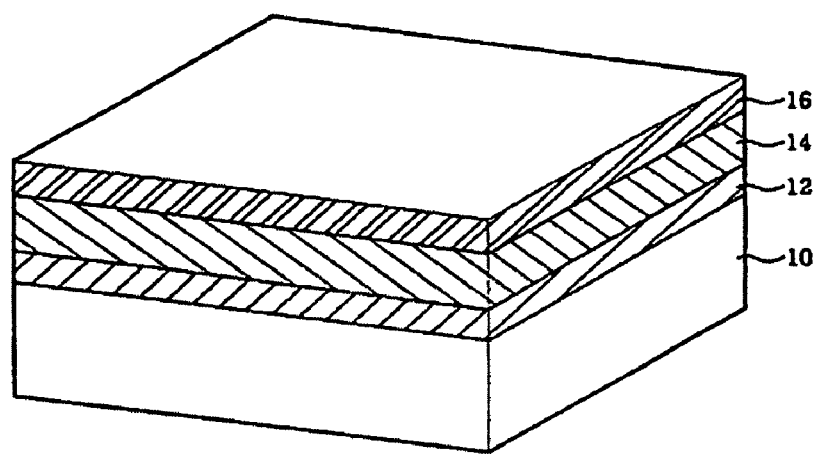
FIG. 1A to FIG. 1D are cross-sectional views showing sequential states of a conventional method of performing a seasoning process for a semiconductor device.
Figure 1B:
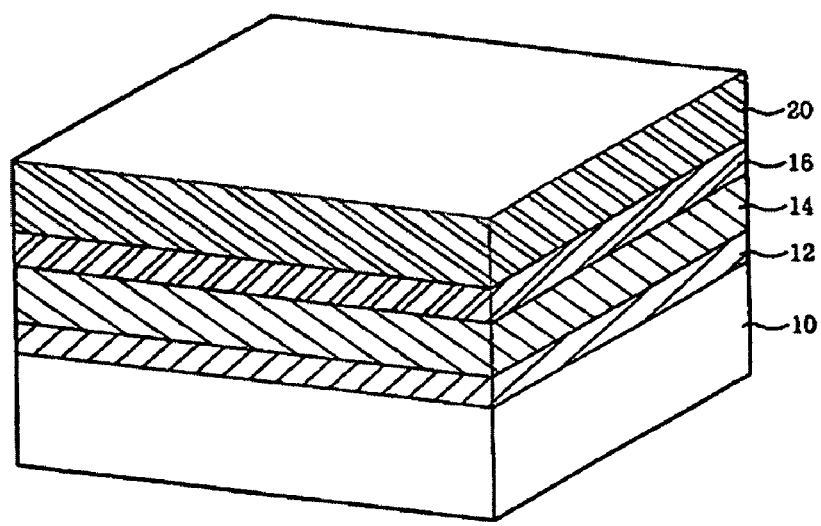
Figure 1C:
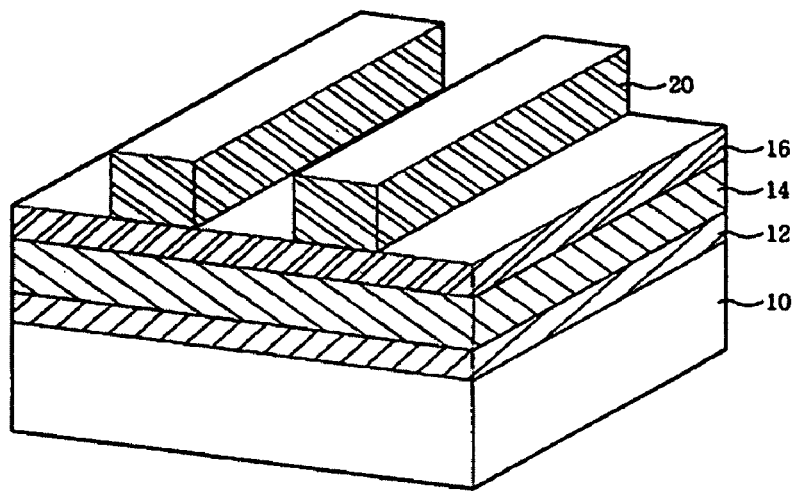
Figure 1D:
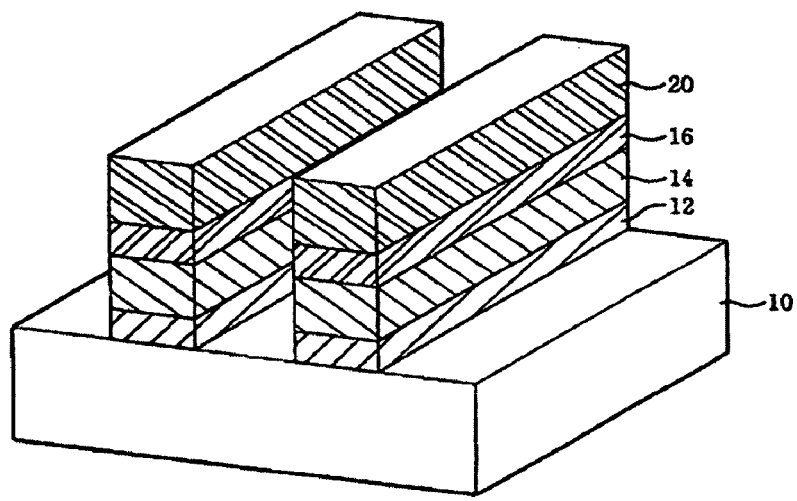
Figure 2:
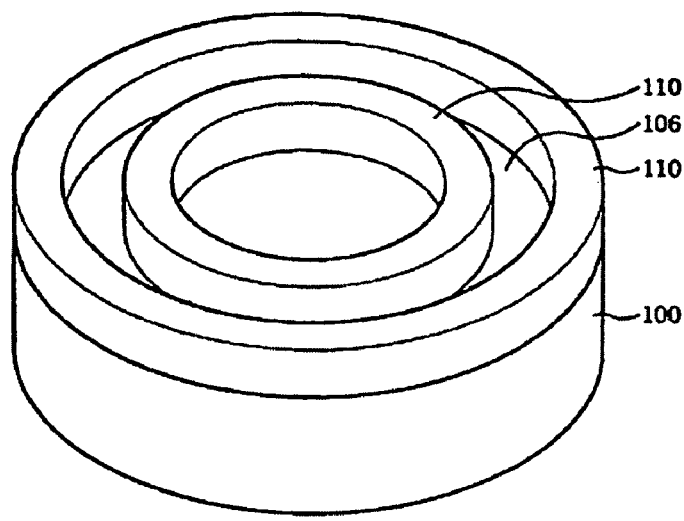
FIG. 2 is a perspective view showing that a photoresist for forming a metal line is coated on a wafer during a seasoning process according to an exemplary embodiment of the present invention.

FIG. 2 is a perspective view showing that a photoresist for forming a metal line is coated on a wafer during a seasoning process according to an exemplary embodiment of the present invention.

Referring to FIG. 2, when an exemplary seasoning process for a semiconductor device processing chamber or apparatus according to the present invention is performed, the photoresist 110 is not coated or patterned on an entire surface of a wafer, but rather is coated in a ring shape such that a central region of the wafer is exposed (or opened) and an edge region of the wafer is covered (or closed). Typically, the semiconductor device processing chamber or apparatus seasoned by the present invention comprises an etching chamber or apparatus, preferably a dry (or plasma) etching chamber or apparatus. Several concentric photoresist pattern portions 110 having ring shapes are formed (or coated) between the central region of the wafer and the edge region thereof. Here, each photoresist pattern portion 110 generally has a ring shape, such as a circular, rectangular, or polygonal shape. On the other hand, reference numeral 100 denotes an insulating layer on a semiconductor substrate (e.g., a test wafer), and reference numeral 106 denotes a metal layer for a metal line or anti-reflection coating layer. The metal layer or anti-reflection coating layer is the material layer to be etched in the present seasoning process. Also, the insulating layer 100 may be located between two metal layers, in which case it can be considered to be an interlayer insulating layer.

According to an exemplary embodiment of the present invention, a photoresist pattern is not formed on the entire surface of a test wafer, but rather is formed in predetermined regions of the test wafer, such as the edge region, and not in a central region of the test wafer. Accordingly, when dry-etching is performed using the test wafer photoresist pattern, the etch residue may be uniformly accumulated on the wafer, and the total amount of etch residue in the etch chamber may decrease.

FIG. 3A to FIG. 3D are cross-sectional views showing sequential stages of a method of performing a seasoning process according to an exemplary embodiment of the present invention.

Figure 3A:
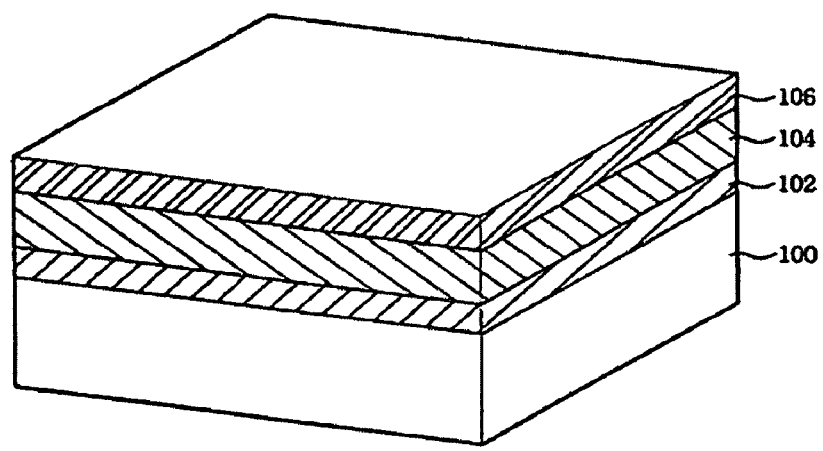
FIG. 3A to FIG. 3D are cross-sectional views showing sequential states of a method of performing a seasoning process for a semiconductor device according to an exemplary embodiment of the present invention.

As shown in FIG. 3A, an anti-reflection coating layer 102, a metal layer 104, and an anti-reflection coating layer 106 are sequentially deposited or formed on an insulating layer 100 to form a (patternable) structure in a semiconductor substrate. Here, the insulating layer comprises an insulating material, such as USG, BSG, PSG, BPSG, etc., and the thickness of the interlayer insulating layer may be 3000 Å or more. The anti-reflection coating layers 102 and 106 may comprise a metal material, such as Ti, TiN, or a metal alloy material such as TiW alloy, and the thickness of each anti-reflection coating layer may be 1.3 µm or more. In addition, the metal layer 104 comprises a metal material, such as Al, Al—Cu alloy or Cu. At this time, the anti-reflection coating layer 102, the metal layer 104, and the anti-reflection coating layer 106 are formed on a test wafer by performing the same manufacturing process as that of an actual running wafer.

Figure 3B:
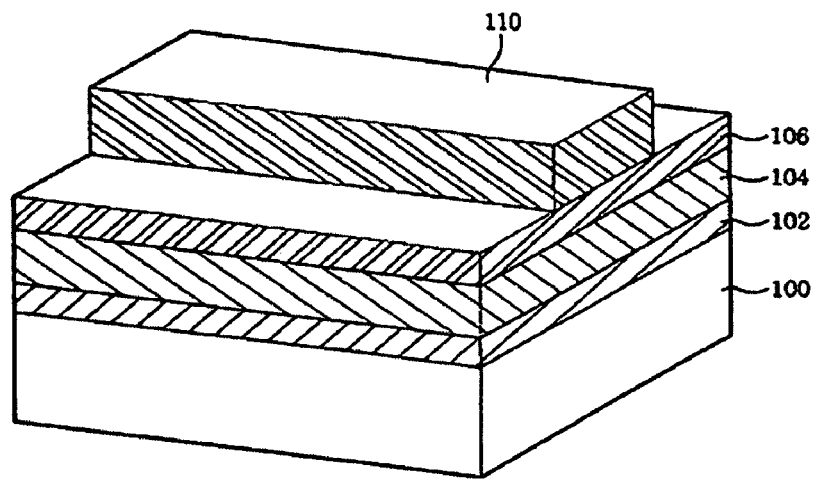

As shown in FIG. 3B, when the photoresist 110 is coated on an upper part of the anti-reflection coating 106 on the test wafer, the photoresist 110 is patterned not on the entire surface of the upper part of the anti-reflection coating 106, but rather in concentric ring shapes, and such that a central region of the anti-reflection coating 106 is opened or exposed and an edge region of the anti-reflection coating 106 is covered or closed. In addition, several photoresist rings 110 are formed in a predetermined gap between the central region and the edge region of the wafer. Here, the photoresist 110 may be located on the outermost 1 cm or more of the edge of the wafer (e.g., the outermost 1 cm, 2 cm, 3 cm, 5 cm, etc.). Also, the innermost 5 cm, 10 cm, 20 cm, 25 cm, or 50 cm, etc. (i.e., a region within a 2.5 cm, 5 cm, 10 cm, 12.5 cm, or 25 cm radius of the center) of the test wafer may have no photoresist thereon, as may be desired or determined empirically or in accordance with certain design or manufacturing considerations.

Figure 3C:
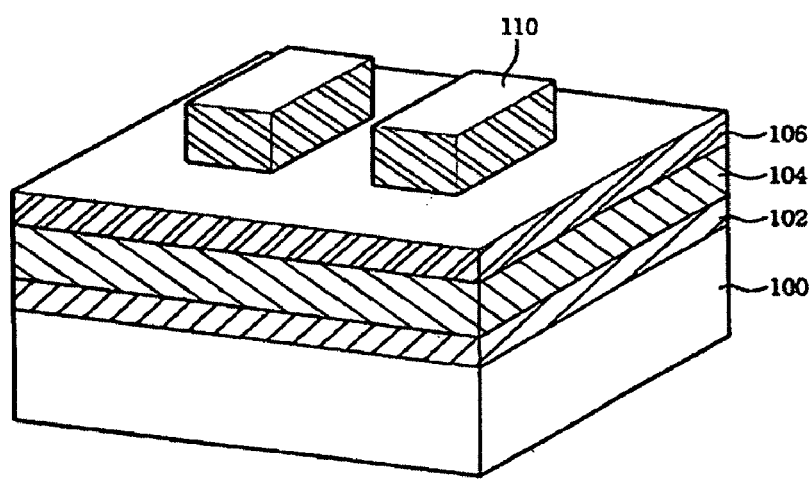

In addition, as shown in FIG. 3C, a pattern to define a metal line region is formed when the ring-shaped photoresist 110 on the test wafer is exposed to photolithographic radiation and developed using a metal line mask.

Figure 3D:
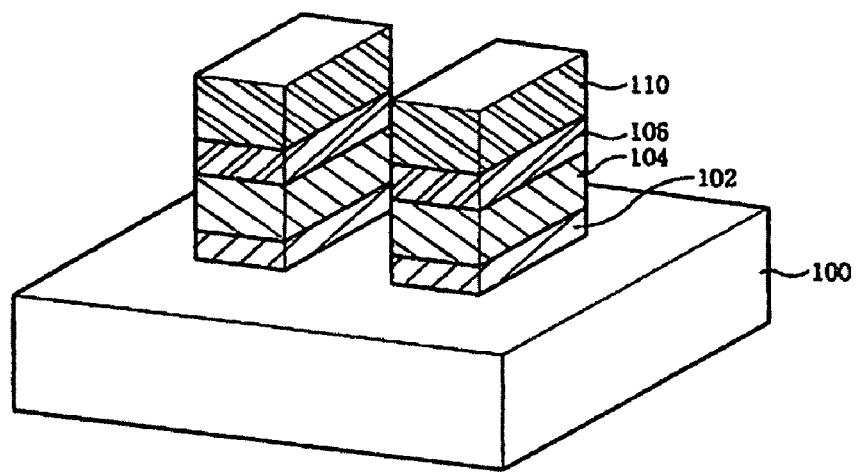

Subsequently, as shown in FIG. 3D, before performing a main etching process in a dry-etching chamber, metal interconnection lines are formed by dry-etching the anti-reflection coating layer 106, the metal layer 104, and the anti-reflection coating layer 102 using the photoresist pattern 110 as an etch mask.

For example, when reactive ion etching is used for a dry-etching process, the anti-reflection coating 106, the metal layer 104, and the anti-reflection coating 102 are dry-etched to an end point (e.g., to a degree such that the insulating layer 100 is exposed). Here, the reactive ion etching is performed under conditions in which a pressure in a dry-etching chamber may be about 8 mTorr, a source power may be about 9000 W, a bias power may be about 200 W or above, $Cl_2$ gas is supplied at a flow rate of about 50 sccm, $BCl_3$ gas is supplied at a flow rate of about 25 sccm, and $CHF_3$ gas is supplied at a flow rate of about 10 sccm.

In addition, the anti-reflection coating 106, the metal layer 104, and the anti-reflection coating 102 may be etched in a 50% overcut etch profile under conditions in which a pressure in the dry-etching chamber may be about 8 mTorr, the source power may be about 9000 W, the bias power may be about 100 W or less, $BCl_3$ gas is supplied at a flow rate of about 25 sccm, $CHP_3$ gas is supplied at a flow rate of about 25 sccm, and Ar gas is supplied at a flow rate of about 50 sccm. Such dry-etching process conditions may be altered or modified by a person of an ordinary skill in the art.

Subsequently, an etching residue, such as of the ring-shaped photoresist pattern 110, polymers, etc., may be removed by one or more ashing processes. As an example, the ashing processes may be performed under the following three process conditions.

A first set of ashing process conditions may include a pressure in the chamber of about 2 Torr, a power of about 1400 W, $O_2$ gas supplied at a flow rate of about 3000 sccm, $N_2$ gas supplied at a flow rate of about 300 sccm, a processing time of about 50 seconds, and a process temperature of about 250° C. In addition, a second set of ashing process conditions may include a pressure in the chamber of about 2 Torr, a power of about 1400 W, $H_2O$ gas supplied at a flow rate of about 750 sccm, $CF_4$ gas supplied at a flow rate of about 75 sccm, a processing time of about 20 seconds, and a process temperature of about 250° C. In addition, a third set of ashing process conditions may include a pressure in the chamber of about 2 Torr, a power of about 1400 W, $O_2$ gas supplied at a flow rate of about 3000 sccm, a processing time of about 205 seconds, and a process temperature of about 250° C.

An etch residue on the test wafer, including the ring-shaped photoresist pattern 110, polymer, etc., may be removed under such ashing process conditions.

Therefore, according to an exemplary seasoning process of an embodiment of the present invention, the total amount of etch residue may be reduced since the etch residue may uniformly occur over the entire wafer, since the photoresist is patterned depending on whether it is in a central region or an edge region of the wafer. That is, the photoresist that is a main source of the etch residue at the central region is not on the central region of the wafer, but it is on the edge region thereof so as to cover or close the anti-reflection coating layer or metal layer that is a main source of the etch residue at the edge portion. Therefore, the etch residue in total may become uniform throughout the central and edge regions of the wafer and/or the total amount of etch residue may be reduced.

As described above, since the dry-etching process is performed after patterning the photoresist in a ring shape so as to open or expose the central region of the test wafer (and thus remove the photoresist that may be a primary source of etch residue or particles in such region) and to close or cover the edge region thereof (and thus protect against etching the antireflective coating and/or metal that may be a primary source of etch residue or particles in such region), the etch residue may be uniformly accumulated on the central region of the wafer and edge region of the wafer, and the total amount of etch residue may decrease. Consequently, test and/or production yield(s) of a semiconductor device may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of patterning a test wafer, comprising:
    forming a material layer on a test wafer;
    coating a photoresist on the material layer to form a plurality of concentric rings, wherein the material layer remains exposed between the concentric rings and in a central region of the test wafer, and the concentric rings cover an edge region of the test wafer; and
    patterning the photoresist to define features in the material layer.

2. The method of claim 1, wherein the plurality of concentric rings are formed in a predetermined gap between the central region of the test wafer and the edge region thereof.

3. The method of claim 1, wherein the edge region comprises an outermost 1 cm or more of the wafer.

4. The method of claim 3, wherein the edge region comprises an outermost 5 cm of the wafer.

5. The method of claim 2, wherein the photoresist may be coated 1 cm or more away from the edge of the wafer.

6. The method of claim 3, wherein the edge region comprises an outermost 5 cm of the wafer.

7. The method of claim 2, wherein each of said concentric rings has a circular, rectangular, or polygonal shape.

8. The method of claim 1, wherein the central region comprises an innermost 5 cm of the wafer.

9. The method of claim 8, wherein the central region consists of an innermost 50 cm of the wafer.

10. A method of seasoning a semiconductor process chamber or apparatus, comprising:
    forming a material layer on a test wafer;
    coating a photoresist on the material layer to form a plurality of concentric rings, wherein the material layer remains exposed between the concentric rings and in a central region of the test wafer, and the concentric rings cover an edge region of the test wafer;
    patterning the photoresist to define features in the material layer; and
    etching the material layer exposed by the photoresist pattern.

11. The method of claim 10, wherein etching the material layer comprises dry etching the material layer.

12. The method of claim 10, wherein the semiconductor process chamber or apparatus comprises a dry etch or plasma etch chamber or apparatus.

13. The method of claim 10, wherein the plurality of concentric rings are formed in a predetermined gap between the central region of the test wafer and the edge region thereof.

14. The method of claim 10, wherein the edge region comprises an outermost 1 cm or more of the wafer.

15. The method of claim 14, wherein the edge region comprises an outermost 5 cm of the wafer.

16. The method of claim 13, wherein the photoresist may be coated 1 cm or more away from the edge of the wafer.

17. The method of claim 16, wherein the edge region comprises an outermost 5 cm of the wafer.

18. The method of claim 14, wherein each of said concentric rings has a circular, rectangular, or polygonal shape.

19. The method of claim 10, wherein the central region comprises an innermost 5 cm of the wafer.

20. The method of claim 19, wherein the central region consists of an innermost 50 cm of the wafer.

* * * * *